United States Patent [19]

Michaud et al.

[11] Patent Number: 4,876,791
[45] Date of Patent: Oct. 31, 1989

[54] APPARATUS FOR AND METHODS OF DIE BONDING

[75] Inventors: Gerard H. Michaud, Furlong; James H. Graham, Pottstown, both of Pa.; Roger P. Stout, Chandler, Ariz.

[73] Assignee: Kulicke & Soffa Industries, Inc., Willow Grove, Pa.

[21] Appl. No.: 170,825

[22] Filed: Mar. 21, 1988

Related U.S. Application Data

[63] Continuation of Ser. No. 855,009, Apr. 22, 1986, abandoned.

[51] Int. Cl.⁴ .............................................. H05K 13/04
[52] U.S. Cl. ......................................... 29/840; 29/709; 29/740; 29/743; 29/759
[58] Field of Search ................... 29/709, 720, 721, 740, 29/743, 759, 840

[56] References Cited

U.S. PATENT DOCUMENTS

| | | | |
|---|---|---|---|
| 3,632,955 | 1/1972 | Cruickshank et al. | 228/180.2 X |
| 3,902,148 | 8/1975 | Drees et al. | 357/69 X |
| 3,946,931 | 3/1976 | Bahnck et al. | 228/102 |
| 3,949,925 | 4/1976 | Keizer et al. | 228/5.5 |
| 3,958,740 | 5/1976 | Dixon | 228/102 |
| 4,010,885 | 3/1977 | Keizer et al. | 228/6 A |
| 4,135,630 | 1/1979 | Snyder et al. | 214/1 BT |
| 4,151,945 | 5/1979 | Ragard et al. | 228/6 A |
| 4,166,562 | 9/1979 | Keizer et al. | 228/5.1 |
| 4,270,649 | 6/1981 | Mayer | 198/341 |
| 4,372,802 | 2/1983 | Harigane et al. | 29/743 X |
| 4,498,023 | 2/1985 | Stout | 310/14 |
| 4,500,032 | 2/1985 | Ackerman | 228/180 |
| 4,510,683 | 4/1985 | Fedde et al. | 29/709 |

FOREIGN PATENT DOCUMENTS

| | | |
|---|---|---|
| 51-65872 | 7/1976 | Japan . |
| 54-27366 | 1/1979 | Japan . |
| 54-58356 | 11/1979 | Japan . |
| 54-58357 | 11/1979 | Japan . |

*Primary Examiner*—Mark Rosenbaum
*Assistant Examiner*—Taylor J. Ross
*Attorney, Agent, or Firm*—Woodcock Washburn Kurtz Mackiewicz & Norris

[57] ABSTRACT

This invention relates to apparatus for and methods of bonding a component to a substrate. More particularly, this invention relates to apparatus for and methods of removing small components, such a dies or other electrical components, from a wafer and bonding the components to a substrate.

54 Claims, 6 Drawing Sheets

APPARATUS FOR AND METHODS OF DIE BONDING

This is a continuation, of application Ser. No. 855,009 filed Apr. 22, 1986, now abandoned.

RELATED APPLICATIONS

This application is related by subject matter to copending application bearing application Ser. No. 855,760, filed Apr. 24, 1986 which is incorporated herein by reference.

BACKGROUND OF THE INVENTION

This invention relates to apparatus for and methods of bonding a component to a substrate. More particularly, this invention relates to apparatus for and methods of removing small components, such a dies or other electrical components, from a wafer and bonding the components to a substrate.

In the production of electronic circuitry, particularly circuitry containing semiconductor chips or dice, there is a need for extremely rapid and accurate placement of the chip or die on a substrate. In many applications a plurality of chips to be placed on the substrate are removably held upon a thin film prior to being placed on the substrate. Each chip must be removed or extracted from the thin film and rapidly transferred to the substrate. In some applications, the chip is only placed on the substrate while in other applications it may be held on the substrate by an adhesive which may also serve as an electrical connection, heat sink, or both. The chips may be of various sizes and configurations and they must be placed on the substrate at precise locations to an accuracy of a few thousandths of an inch.

Rapid production of high quality chip/substrate assemblies requires a precision apparatus which incorporates effective quality control features. For example, in order to remove the chip from the wafer without damage, it is required that the chip is precisely aligned to the tool or tools which will remove it. It is also necessary that the interaction between the removing tool or tools and the chip is not so violent so as to cause damage to the chip. Effective quality control also requires that substandard or defective chips be detected and passed by so that the production or sale of a defective chip/substrate assembly is avoided. It is also required that the tool or tools which place the chip upon the substrate do not do so with such violence so as to cause damage to the chip or the substrate. This is particularly true when complex function chips or very large chips are being bonded to the substrate by the application of epoxy or some other adhesive. The prior art has satisfied the above listed needs only partially Prior art devices generally place the wafer or other component holding device in substantially the same plane as the substrate. Assembly of the chip to the substrate proceeds in assembly-line fashion wherein a pick up head moves along a relatively long horizontal axis between a pickup station and a placement station. This arrangement often requires that the pick up head be movable over long distances and in several directions. For example, see U.S. Pat. No. 3,958,740—Dixon in which the pick up head is movable along a horizontal axis, a vertical axis, and is rotatable about the vertical axis. This arrangement not only requires complex and bulky pick up head assemblies, but also limits the capacity of the apparatus by making the distance through which the head assembly travels a function of the size of the wafer and/or the substrate. That is, as the substrate and/or wafer size increase, the distance the head must travel to pickup the die and place it on the substrate will also generally increase. Thus, the time required to produce each assembly is increased. This is especially important in light of current trend in the industry toward larger and larger wafers.

Other prior art applications employ carousel type devices having several stations located along the path of a rotary member as disclosed in U.S. Pat. No. 3,946,931—Bahnck et al. Devices of this type have the disadvantage of requiring separate and independent stations for the several functions required of a bonding apparatus. That is, a device of this type consists of a substrate loading station, a substrate aligning station, a tack bonding station, a substrate monitoring station, a final bonding station, a second monitoring station, and a substrate unloading station. As a result, devices of this type tend to be large and relatively slow. In addition, devices of this type also hold the wafer and the substrate on substantially the same plane. As a result, the distance the bond head must travel will generally increase as the size of the wafer and/or the substrate increases.

As already mentioned, a device which produces an unnecessarily large force on the chip during the transfer process can damage or destroy the chip or the resulting chip/substrate assembly and thereby reduce the effective capacity of the apparatus. On the other hand, a device which does not utilize sufficient removal or placement force when transferring the chip from the wafer to the substrate can cause missed pickups or poorly bonded chips. Thus, the ability to regulate or adjust the pickup and/or placement force according to the dictates of the particular application would increase apparatus efficiency and thereby improve productivity. In addition, the advantage of providing an adjustable tool for reducing violent chip/substrate interaction may become more important in the future. This is so because Gallium Arsenide (GaAs) chips, which are relatively fragile, are potentially the "chip of the future". See for example SMTRENDS, Volume 2, No. 12, page 3, column 3. The prior art, however, has used pickup and placement techniques which provide little or no ability to adjust the pickup and placement force. For example, the devices disclosed in U.S. Pat. Nos. 4,166,562—Keizer et al and 4,500,032—Ackerman both utilize spring loaded actuating means for unloading and loading the chip. U.S. Pat. No. 3,946,931—Bahnck et al discloses the use of a mechanical lever arm for removal and placement of the chip. None of the these devices permit ready adjustment

SUMMARY OF THE INVENTION

Accordingly, it is an object of the present invention to provide faster and more efficient methods of assemblying Components It is another object of the invention to substantially reduce the size and complexity of the apparatus used for transferring components from a wafer to a substrate.

It is a further object of this invention to substantially increase the rate of component assembly by minimizing the distance through which the transfer tool or tools must travel.

It is a further object of this invention to increase the effective production rate of a component assembly apparatus by minimizing the damage to the components caused by interaction of the assembly tool with the component.

It is another object of this invention to increase the productivity of a component assembly apparatus by providing an apparatus which does not limit the size of the wafer or substrate utilized in the assembly process.

Accordingly, a particular apparatus of this invention includes a component holding means for holding the component in a first plane, a substrate holding means for holding the substrate in a second plane substantially parallel to and spaced from the first plane, and means movable between a pickup position and a placement position for transfer of the component from the holding means to the substrate such that the component travels through a path which is not primarily parallel to said planes.

According to one aspect of this invention, the tool used in a component assembly apparatus for transfer of the component comprises a means for interaction with the component, and a transducer means responsive to electrical stimulus for actuating the interacting means such that the interactive force between the tool and the component is related to the extent of the electrical stimulus.

A particular method for the practice of this invention includes holding the wafer and substrate used in the assembly process in spaced and substantially parallel planes, removing the component from the wafer with a pickup tool located between the planes and adapted to releasably hold the component, rotating the tool about an axis substantially parallel to the planes, and placing the component on the substrate.

DESCRIPTION OF THE PREFERRED EMBODIMENT

The Wafer and the Substrate

Figure 6A:
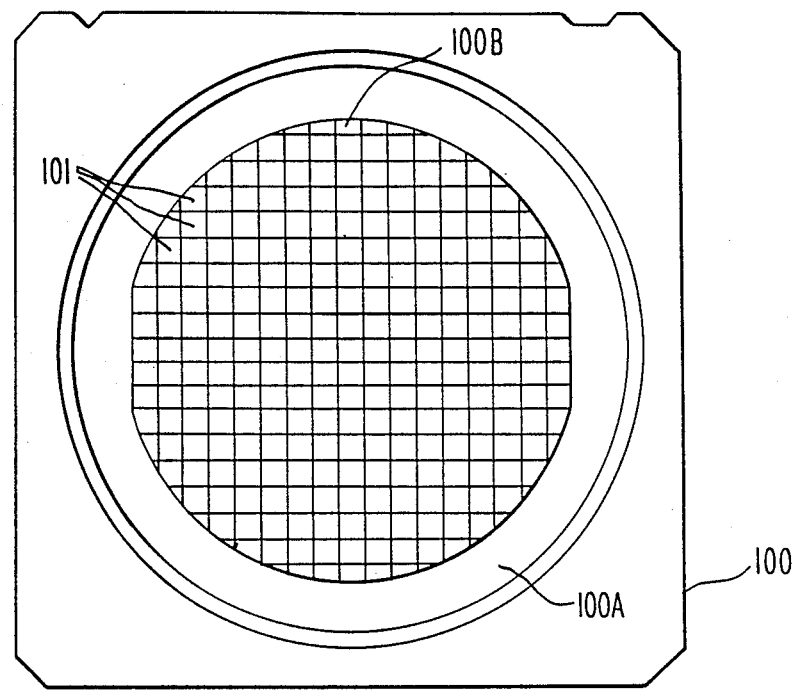
FIG. 6a is a plan view of the wafer used with this invention.
Figure 6B:
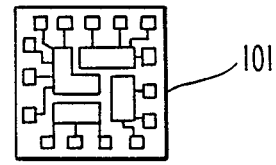
FIG. 6b is a detailed plan view of the die used with this invention.
Figure 6C:
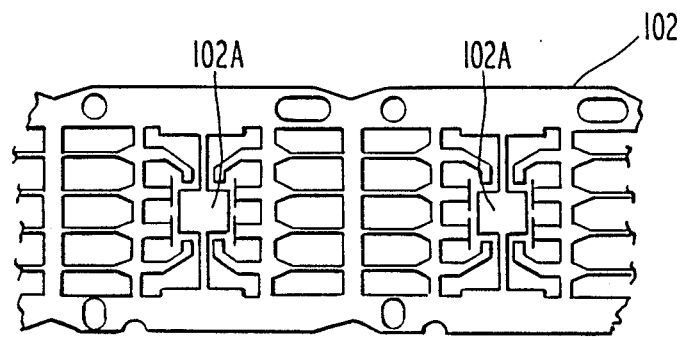
FIG. 6c is a detailed plan view of the substrate used with this invention.

The present invention is described in relation to an apparatus for bonding a microchip, also known as a die, to a bond site on a metallized substrate. It will be appreciated by those skilled in the art that this invention may be readily used in many applications requiring the removal of a component from a holding means and placement of that component onto a substrate. In the preferred embodiment of this invention, a thin adhesive film 100A is used to hold a matrix of dice while a metallic substrate provides the bond site as shown in FIGS. 6a through 6c. The wafer, as disclosed in FIG. 6a, comprises a thin adhesive film 100A mounted to a metal or plastic frame 100. A semiconductor wafer 100B is attached to the film 100A and sawn on the film into individual dice 101. FIG. 6c shows the metallized substrate 102 to which the die 101 is to be mounted or placed. The die is to be placed precisely at the bond site 102A of the substrate 102. The embodiment described below is directed towards transfer of the die 101 from wafer 100 to the substrate placement site 102A of the substrate 102

The Apparatus in General

Figure 1:
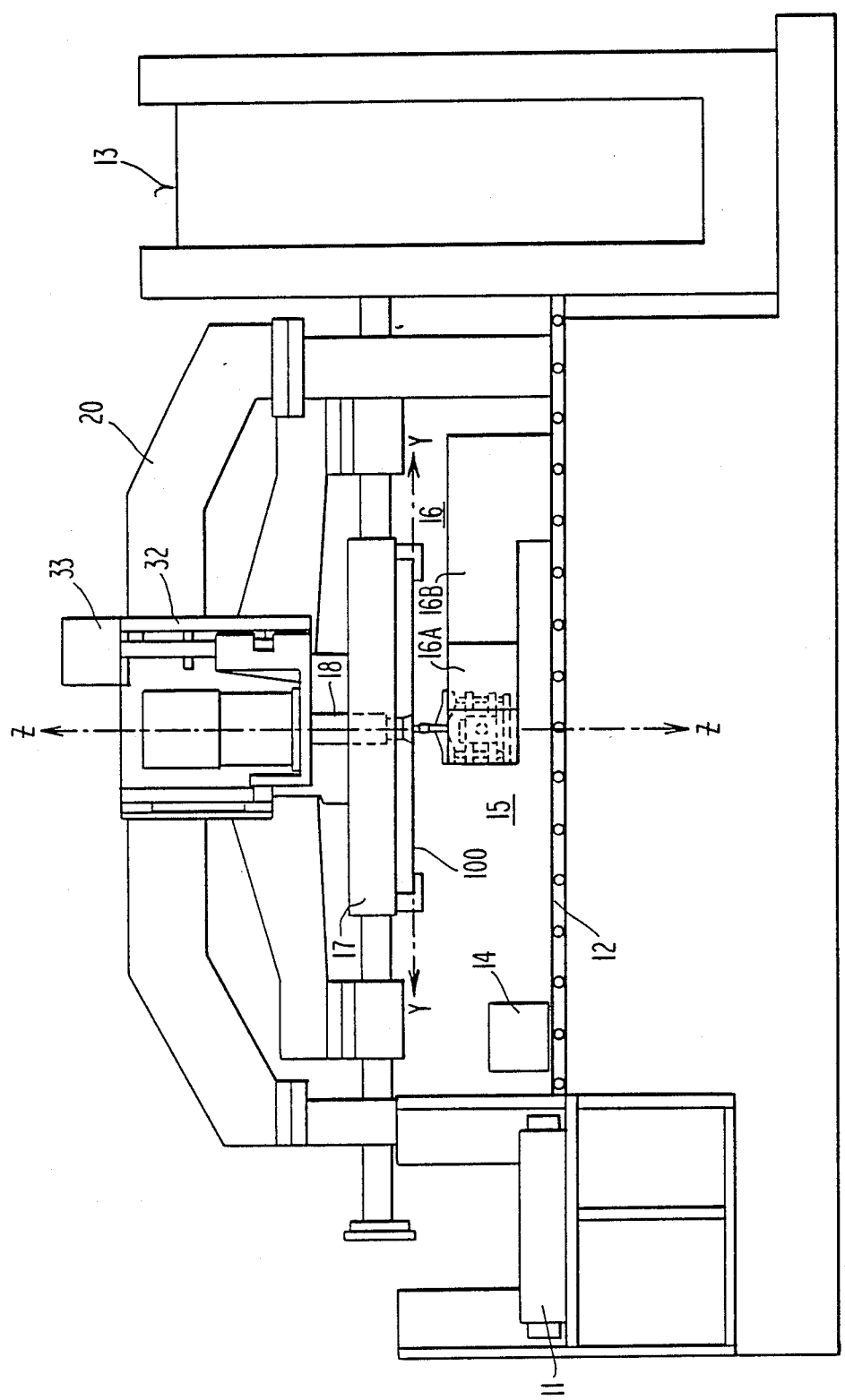
FIG. 1 is a front elevation view of the die bonding apparatus according to one embodiment of this invention.

The die bonding apparatus, generally referred to as 10, is disclosed in FIG. 1. The die bonding apparatus 10 contains substrate holding tray 11 for holding a plurality of substrates 102. The substrate is placed by and one of several mechanisms well known in the art onto a substrate holding means, which in the preferred embodiment is substrate locating track 12. The substrate is moved from holding tray 11, along track 12, and to product tray 13, where it is removed from the track to the product tray by any one of several mechanisms well known in the art. As the substrate travels from tray 11 to tray 13, it will stop, if required, at epoxy station 14 for the application of adhesive. The substrate 102 then continues along track 12 until a bond site 102A is at a placement location in aligned registry below the die bond head, generally designated as 15. Anyone of several means well known in the art for operating track 12 so as to cause the registry of bond site 102A at the placement location may be used. In FIG. 1, the die bond head 15 is for the most part shown in phantom by the dash lines since it is hidden by optical portion 16.

Sawn wafer 100B is held by a component holding means in a plane spaced from and substantially parallel to the substrate holding means In the preferred embodiment of this invention, the component holding means comprises XY table 17. As the term is used herein, an XY table refers to any means well known in the art for holding a wafer frame in a given plane while having the capacity to move that wafer to various positions within the plane. In the preferred embodiment of this invention, the XY table holds the wafer in a substantially horizontal plane. In order to more clearly describe the invention, the following three reference axes will be referred to: the X axis, the Y axis, and the Z axis. The Z axis is that line which passes through the central axis of die eject head 18 and chuck 19 of bond head 15 as shown in FIG. 1. The Y axis is that axis which perpendicularly intersects the Z axis where the Z axis intersects sawn wafer 100B thereby creating a substantially vertical ZY plane. The X axis is that axis which is perpendicular to both the Z and the Y axes and intersects each of those axes at the same point thereby creating a substantially horizontal XY plane coincidental with wafer sawn 100B. The XY plane is best revealed in FIG. 3. It will be appreciated by those skilled in the art that the designation of the X, Y, and Z axes in this fashion is completely arbitrary and is used for illustration and reference purposes only. XY Table 17 holds wafer frame 100 so as to be substantially immobile in the Z direction while having means to move wafer frame 100 within the XY plane. In this way, each die 101 may be placed in a pickup location in aligned registry directly above center of rotation of the die bond head 15 and directly below die eject head 18. Anyone of several means well known in the art for moving XY table within the XY plane may be used. The means and apparatus used in conjunction with the XY table to precisely place die 101 in the pickup location is described later in the specification and in copending application bearing attorney's docket number KS-3, assigned to the assignee of this invention. With both die 101 and bond site 102A in proper registry, die eject head 18 and die bond head 15 combine to remove the die from the wafer, whereupon the die bond head rotates to move die 101 into aligned registry with the bond site, as best shown in FIG. 4. The die bond head 15 then places the die 101 in the proper bond site 102A and returns to the position shown in FIG. 1. When all the bond sites on each substrate have a die bonded thereto or placed thereupon, the substrate continues along track 12 and is loaded into substrate product tray 13.

Die Removal and Placement - Apparatus

Figure 2:
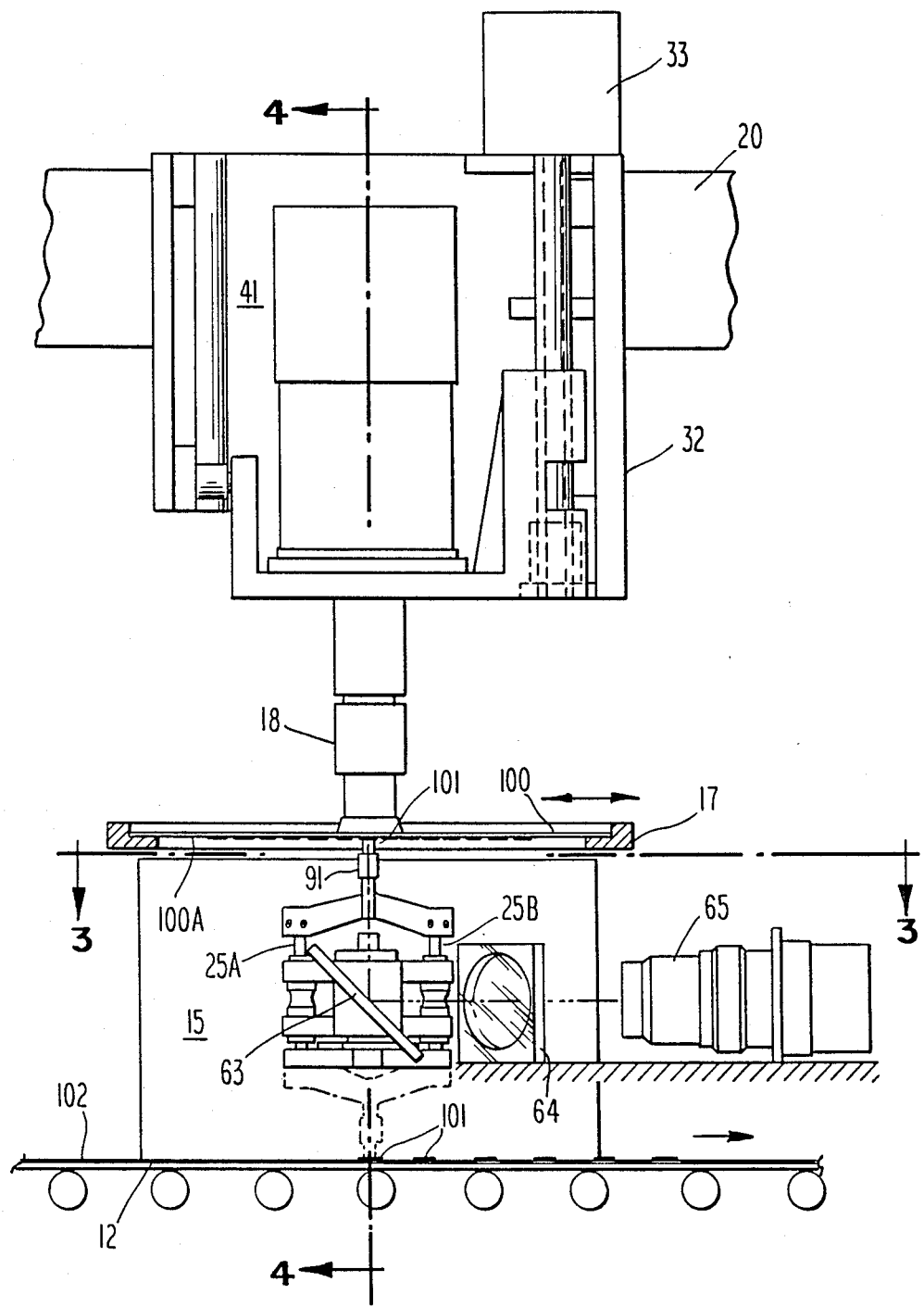
FIG. 2 is a detailed elevation view of the die bonding apparatus of FIG. 1 showing in more detail the die eject head, die bond head, and the optics used in this invention.

Referring now to FIGS. 1 and 2, an important feature of this invention resides in the spatial relationship between sawn wafer 100B and substrate 102. According to this invention, die bonding apparatus 10 is configured so as to hold dice 101 in a first plane which is spaced from and substantially parallel to a second plane in which the substrate is held. In the preferred embodiment, wafer frame 100 is held in an "upside" down fashion by XY table 17 in the substantially horizontal XY plane. The "upside" or sawn wafer side of wafer frame 100 faces downward toward substrate 102, as is shown in FIG. 2. In this embodiment, substrate 102 is held in a substantially horizontal plane below wafer frame 100. By maintaining the spatial relationship disclosed herein, the XY dimensions of sawn wafer 100B and substrate 102 are theoretically limitless since the planes will never intersect. In this way, the overall bonding time per die is reduced since the time required per die to load and unload the wafer and/or substrate decreases as the size of the wafer and/or substrate increases. In addition, by locating the substrate and wafer in spaced and parallel planes, the distance and time required to transfer die 101 from wafer 100B to bond site 102A is minimized. This is so because the distance between the die and the substrate is not a function of the wafer or substrate size. Therefore, in the preferred embodiment of this invention, the substrate bond site 102A is placed directly below the die to be removed. In this way, the distance through which the die must travel from the wafer to the substrate may theoretically be reduced to the distance between the planes. This is especially significant in light of the rapid advancement in the production of small or miniature precision tools. As precision tooling allows bond die head 15 to be made with smaller and smaller dimensions, the distance between the wafer and the substrate can accordingly be reduced. The reduced distance between the substrate and the wafer will in turn result in a shorter time required for the chip to substrate transfer. The spacial relationship between wafer frame 100 and substrate 102 as disclosed by this invention is also extremely significant for embodiments in which no tools are placed between the planes. That is, the tool or tools used to transfer die 101 to substrate 102 may be contained entirely above wafer 100 and/or below substrate 102 In embodiments of this type, the distance the die 101 must travel from wafer 100 to bond site 102A can be reduced to negligible dimensions. Accordingly, it will be appreciated by those skilled in the art that the spacial relationship between sawn wafer 100B and substrate 102 disclosed in this invention permits significant advances in the rate at which chip/substrate assemblies are produced.

The apparatus used for transferring a die 101 from sawn wafer 100B to a bond site 102A on substrate 102 will now be described. It will be appreciated by those skilled in the art that while this invention is described with regard to the removal of a small semi-conductor chip, also known as a die, from a thin adhesive film to a bond site on a metallized substrate, the apparatus made according to this invention may be easily adapted to remove components other than dies from supporting structures other than adhesive film and place those components on a supporting structure other than a metallized substrate.

Figure 3:
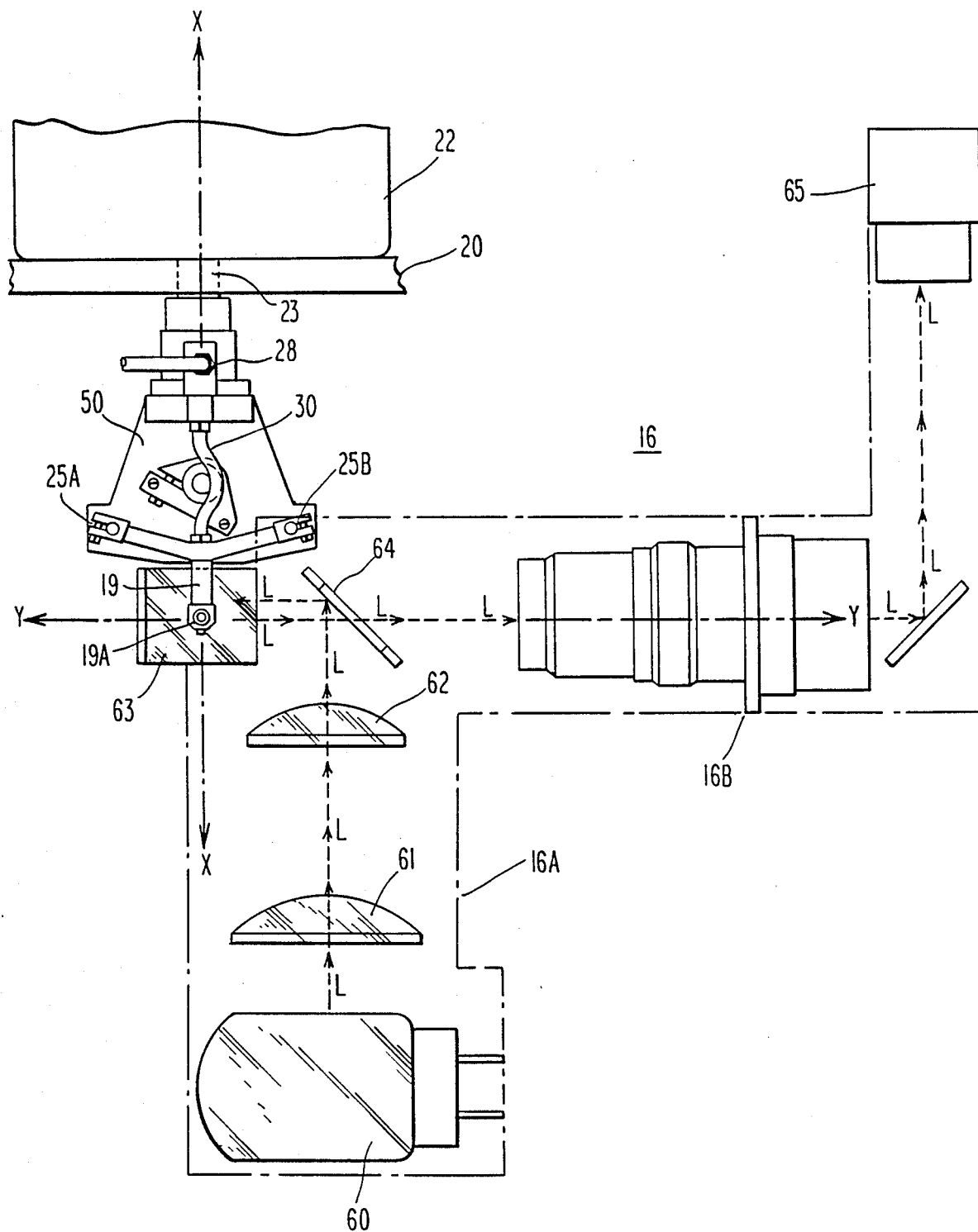
FIG. 3 is a top plan view of the die bond head and the optics associated therewith, taken substantially along line 3—3 of FIG. 2.
Figure 4:
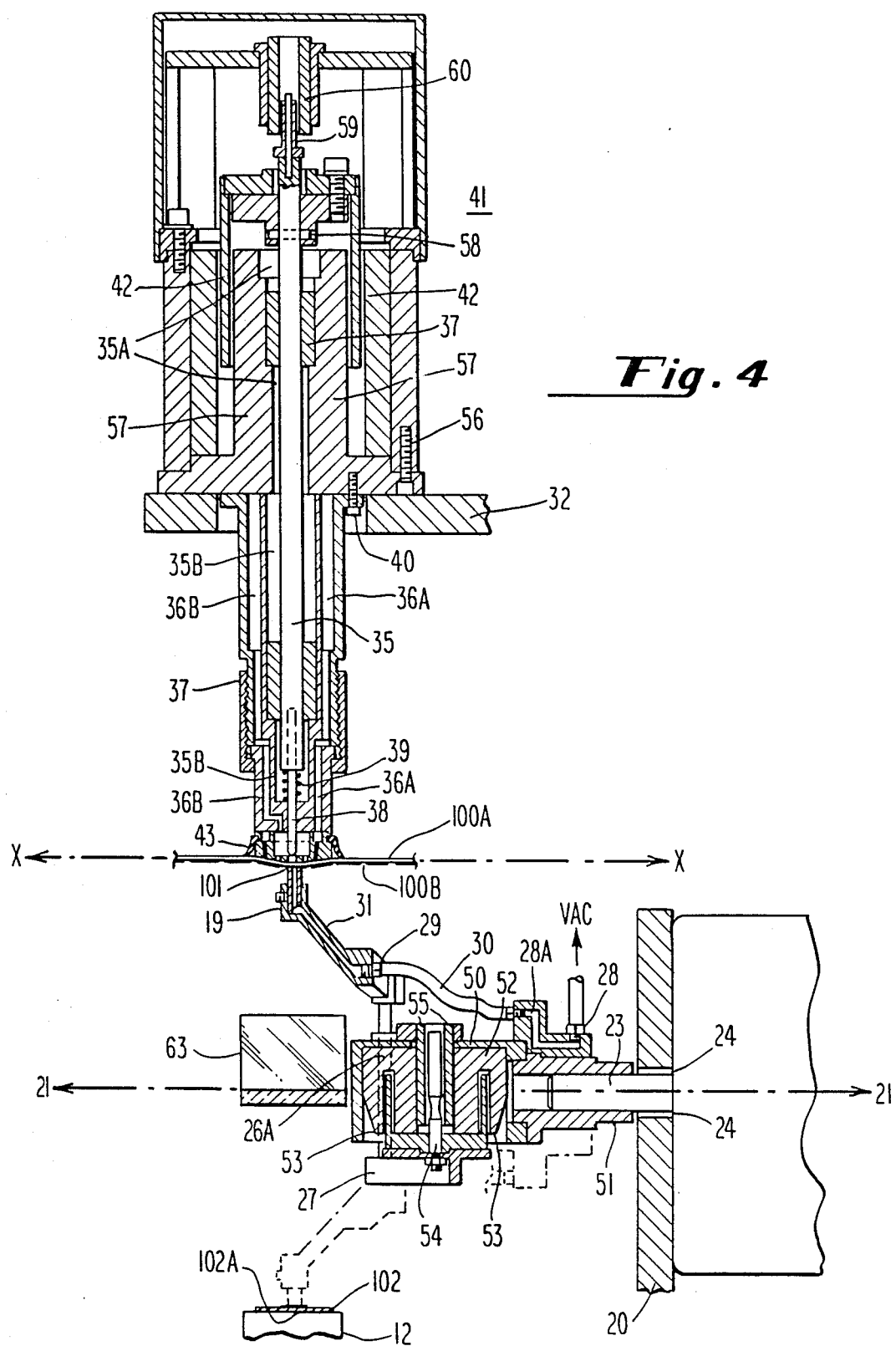
FIG. 4 is a cross-sectional view of the die eject and die bond head taken substantially along line 4—4 of FIG. 2.

Referring now to FIGS. 2, 3 and 4, the component transfer means for transferring die 101 to substrate bond site 102A is disclosed. FIG. 2 reveals a close-up view of the central portion of the component transfer means of this invention. In this view, the light source used in conjunction with optics 16 of this invention has been substantially cut away to more fully reveal die bond head 15. Chuck 19 of die bond head 15 is located directly below die eject head 18. Die 101 is in a pickup location between chuck 19 and die eject head 20 and is ready for removal from the wafer. Die 101 is precisely placed in this position by XY table 17 by any one of several means known in the art or in the manner described in detail later in the specification. As best revealed in FIG. 4, the component transfer means of this invention comprises tool 19 removably mounted to head 15 and head 15 in turn rotatably mounted to frame 20 of die bonding apparatus 10. The die bond head 15 is rotatable about the axis labeled 21 in FIG. 4. Axis 21 is parallel to and aligned with the X axis as shown. The central shaft 23 of the die bond head 15 is supported by bearings 24 in frame 20 and is rotatably attached to motor 22 for rotation about axis 21. Tool 19 is movably mounted to bond head 15 such that the movement of tool 19 is normal, or perpendicular, to the die when in the position shown in FIG. 4. Shafts 25A and 25B which are attached to chuck 19 on one side, pass through a pair of channels 26A and 26B in bond head 15 and are connected on the other side thereof to connecting plate 27. Connecting plate 27 is in turn attached to an actuating means mounted to the die bond heat 15. This actuating means may be anyone of several actuating means well known in the art, or preferably the actuating means which is shown in FIG. 4 and described latter in the specification. The tool 19 can be actuated towards and away from die 101 when in the position indicated by the solid lines in FIG. 4, and towards and away from substrate 102 when in the position indicated by the dashed lines in FIG. 4.

A vacuum, generated by any means well known in the art, may be applied to vacuum port 28 in die head 15. The vacuum passes through channel 28A and is then passed to vacuum port 29 in chuck 19 by vacuum hose 30. Channel 31 in tool 19 passes from vacuum port 29 to the face 19A (seen in FIG. 3) of tool 19. Application of vacuum to port 28 thus provides tool 19 with an interacting means or, more particularly, a gripping means on the end thereof. In this way, die 101 may be releasably held by the vacuum when the face 19A of chuck 19 is placed in contact with die 101 and vacuum is applied to vacuum port 28.

Referring once again to FIG. 2, die eject housing 32 is movably mounted to frame 20 of die bonding apparatus 10. Housing motor 33 is mounted to housing 32 in any conventional manner so as to actuate the housing towards and away from wafer frame 100B. In this way, die eject head 18, which depends from housing 32, can move to a noninterfering position. With respect to wafer frame 100 so that spent wafer frames can be removed from and new frames placed upon XY table 17. Referring once again to FIG. 4, the central portion of the die eject assembly is revealed in cross-section. Die eject head 18 is adapted to releasably hold the film side of wafer frame 100 by means of a vacuum. A vacuum, generated by any conventional means well known in the art, is transmitted to the end of die eject head 18 by vacuum channels 36A and 36B. Seal ring 43 is coupled to the end of die eject head 18 so that the end of the die eject head will normally sealably engage the film side of wafer frame 100, and thereby releasably hold the wafer against the surface of the die eject head. When vacuum is applied to die eject head 18, the flexible sawn wafer 100B conforms to the slight concave surface of the head. The concave surface of die eject head 18 deforms wafer 100B and achieves the following two objectives: (1) it facilitates removal of die 101 by "pre-deforming" the wafer, and (2) it enhances recognition of the die to be removed, as disclosed in copending application bearing Ser. No. 855,760.

The configuration and use of the two vacuum channels 36A and 36B provides an important feature o f this invention. In the preferred embodiment of the invention, each channel is connected to an independently operated vacuum generating means. As best disclosed in FIG. 4, channel 36A applies vacuum primarily to the outer portion of die eject head 18, while channel 36B applies vacuum primarily to the central portion of the die eject head. By connecting each channel to independently controlled generating means, the extent of "grip°" on film 100A can be adjusted along the radial direction of die eject head 18. Thus film 100A may be gripped tightly at the periphery of die eject head and relatively loosely at the center in order to facilitate removal of the die 101. In another embodiment of this invention, one or both of channels 36A and 36B may be alternatively attached to a positive pressure generating means, such as a small pump for example. In this way, an air bearing may be created between the film 100A and the end of die eject head 18 so that the die 101 to be removed is more efficiently placed at the proper pickup location, as discussed in more detail later in the specification.

Die eject head 18 depends from housing 32 and is mounted thereto by mounting bolt 40. Actuating means, generally designated as 41, is aligned with die eject head 18 and is mounted to housing 32. This actuating a means may be anyone of several actuating means well know in the art, or preferably the actuating means shown in FIG. 4 and described in detail latter in the specification. Connecting shaft 35 is contained within multi diameter chamber 35A of actuating means 41 and multi diameter chamber 35B of die eject head 18. Connected to the lower portion of connecting shaft 35 is die eject pin 38. Also attached to the lower end of connecting shaft 35 is resilient spring 39 which connects the end of shaft 35 to the bottom of channel 35B and thereby normally urges shaft 35 in an upward direction. The upper end of shaft 35 is attached to actuating means 41. In this way, die eject pin 38 is actuatable to a protruding position with respect to the lower end of die eject head 18, thereby deforming the film 100A on the backside of wafer 100B and aiding in the removal of die 101 from the wafer. The details concerning the exact removal and placement process utilized with the apparatus of this invention is disclosed in detail below.

Die Removal and Placement—Method

Figure 5A:
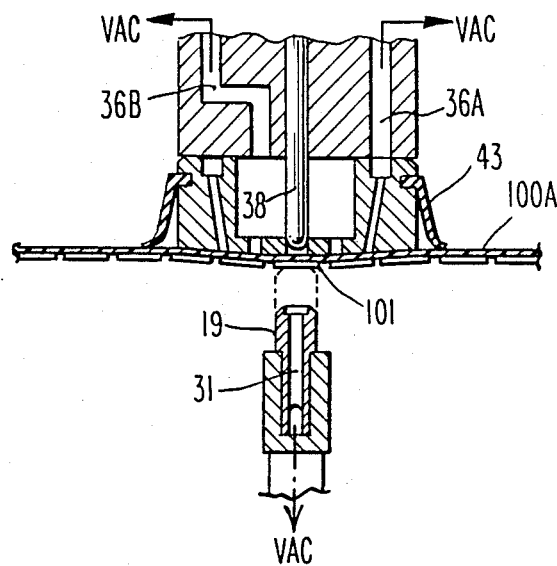
FIGS. 5a through 5e are sequential views of the die bond and the die eject heads according to this invention as the die is removed from the wafer and transferred to the substrate.

When the apparatus of this invention as previously described is used according to the methods of this invention, an advantageous die bonding system is achieved. Accordingly, FIGS. 5a through 5f disclose sequential views of the apparatus of this invention being used according to one embodiment of this invention. Referring to FIG. 5a, a magnified view of tool 19 and die eject head 18 in a preremoval position is disclosed by the solid lines. Die 101 has been moved to a pick-up location in alignment with die eject head 18 and tool 19 by the XY table. The methods and apparatus used for precisely locating die 101 in this position is disclosed later in the specification. When die 101 is properly located as disclosed in FIG. 5a, vacuum is applied by any conventional vacuum generating means to chambers 36A and 36B as disclosed by the arrows marked vacuum in that Figure. This vacuum, in conjunction with seal ring 43, serves to releasably hold the film 100A against the slightly concave lower surface of die eject head 18. Die eject pin 38 provides an interacting means for deforming wafer film 100A and thereby aiding in the removal of die 101 from the wafer. In the position shown in FIG. 5a, the axis of die eject pin 38 is aligned with the center of die 101. A vacuum is also applied by any conventional vacuum generating means to the face 19A of tool 19 through chamber 31. Face 19A thereby provides a second interacting means for removably holding die 101. In this position, the central axis of tool 19 is also aligned with the center of die 101. Therefore, the axis of tool 19, the axis of die eject pin 38, and the center of die 101 are all coincidental with the Z axis as shown in FIG. 5a. Once in the position disclosed by the solid lines in FIG. 5a, tool 19 is actuated towards die eject head 18 until the surface 19A of tool 19 contacts die 101 as shown by the dashed lines in FIG. 5a. In the preferred embodiment of this invention, the force with which tool face 19A contacts die 101 is adjustable by adjusting the electrical stimulus to the actuating means as disclosed later in the specification. In the preferred embodiment of this invention, movement of tool 19 from the position disclosed by the solid lines in FIG. 5a to the position disclosed by the dotted lines in FIG. 5a is carried out in a time less than about 50 milliseconds.

Figure 5B:
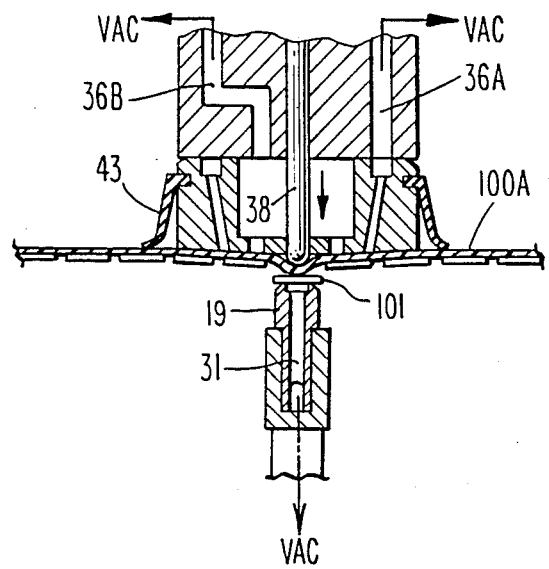

Once the face 19A of tool 19 has contacted die 101, the die is removed from wafer 100B as disclosed in FIG. 5b. In this Figure, die eject pin 38 has been actuated into a protruding position relative to the end of die eject head 18 so as to deform film 100A in the immediate vicinity of die 101. In the preferred embodiment, the independent application of vacuum as provided by channels 36A and 36B is advantageously employed during this step. That is, the vacuum applied to the central portion of die eject head 18 is relatively weak in order to facilitate deformation of film 100A, while the vacuum applied to the peripheral portion of the die eject head is relatively strong so that the film remains stable. In synchronized fashion, tool 19 has been actuated away from wafer 100B as die eject pin 38 is actuated to the protruding position seen in FIG. 5b. It should be noted that the vacuum applied to die eject head 18 and tool 19 continues to exist through this step. The vacuum applied to die eject head 18 insures that the deformation of wafer film 100A occurs substantially only in the region of die 101 to be ejected. The vacuum applied to tool 19 insures that as the adhesive bond between die 101 and film 100A is broken, the die is held firmly and precisely on the face 19A of the tool. In the preferred embodiment, the force used for actuating die eject pin 38 and tool 19 may be adjusted by the adjustable actuating means discussed later in the specification. In this way, only that force required to remove die 101 from film 100A is applied and therefore the risk of damage to the die is minimized. In the preferred embodiment of this invention, the die moves from the position shown by the dotted lines in FIG. 5a to the position shown in FIG. 5b in less than about 50 milliseconds.

Figure 5F:
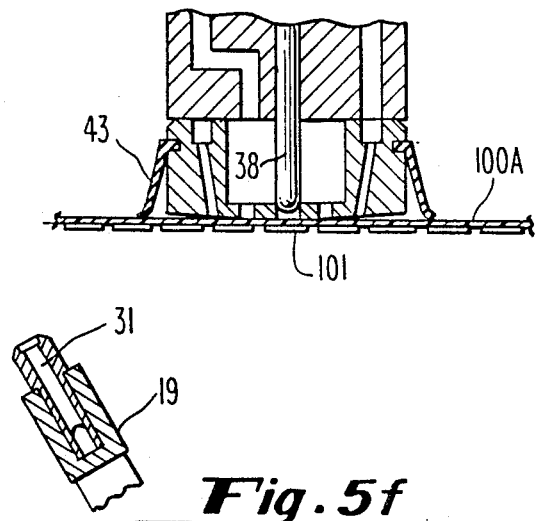
Figure 5C:
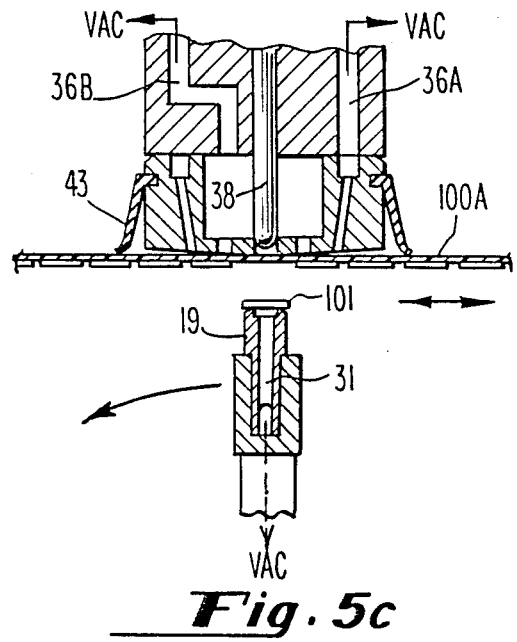

Once die eject pin 38 has been actuated out of die eject head 18 a predetermined distance as shown in FIG. 5b, the pin is retracted to a nonprotruding position as disclosed in FIG. 5c. While pin 38 is retracting into die eject head 18, tool 19 continues to be actuated away from wafer frame 100 so as to insure that die 101 is fully removed from the wafer and in a noninterfering position with the dice that remain on the wafer. In a preferred embodiment of this invention, movement of apparatus from the position disclosed in FIG. 5b to the position disclosed in FIG. 5c requires less than about 30 milliseconds. Once the position as disclosed in FIG. 5c is achieved, XY table 17 will begin to move wafer frame 100 so as to locate the next die to be removed in the proper pick-up location. In one embodiment of this invention, channel 36A or channel 36B may be adapted to receive application of positive pressure thereto so that the movement of the wafer frame 100 will be facilitated during this step. For example, channel 36A may be connected to a vacuum generating means while 36B is connected to a means for generating positive pressure. During the steps disclosed in FIGS. 5a and 5b, vacuum is applied to channel 36A so as to grip film 100A so that die 101 may be removed. Once die 101 is removed as disclosed in FIG. 5c, the vacuum generating means is disconnected and a positive pressure is applied to channel 36B. This positive pressure will create a cushion of air or an "air bearing" between film 100A and the end of die eject head 18. In this way, film 100A travels on a relatively friction free cushion of air so that the film moves easily under die eject head 18. This results in the ability to more precisely place the next die at the proper pickup location since friction between the film and the end of the die eject head does not interfere with the smooth operation of XY table 17.

Figure 5E:
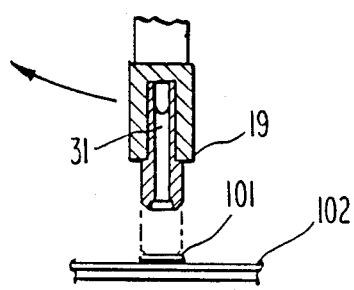
Figure 5D:
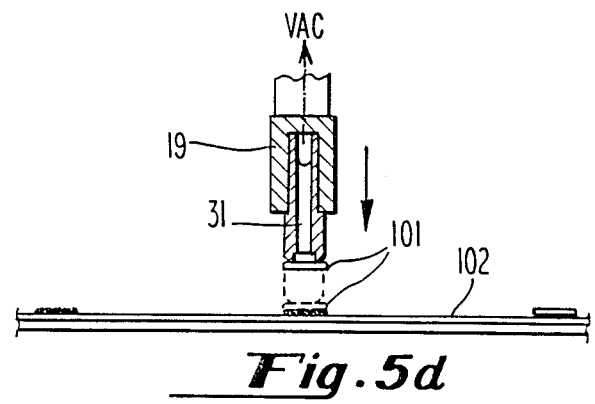

Once the position disclosed in FIG. 5c has been achieved, tool 19 is rotated substantially 180° about axis 21 (as shown in FIG. 4). This rotation results in the alignment of face 19A of tool 19 with bond site 102A as shown in FIG. 5d. It should be noted that bond site 102A is placed in a placement location by means which are conventional in the art and form no part of this invention. In the preferred embodiment of this invention, the placement location is such that the center of bond site 102A is coincidental with axis Z. In this way, rotation of substantially 180° by tool 19 brings die 101 into precise registry above bond site 102A. As disclosed in FIG. 5d, bond site 102A has received an application of epoxy or adhesive prior to being moved to the placement location. In the preferred embodiment, movement of the apparatus from the position indicated in FIG. 5c to the position indicated in FIG. 5d is accomplished in less than about 60 milliseconds.

Once in an aligned and registered position as disclosed in FIG. 5d, tool 19 is actuated towards substrate 102 so as to place die 101 precisely on bond site 102A as disclosed by the dash lines. In the preferred embodiment of this invention, the force exerted upon die 101 and substrate 102 as tool 19 places the die upon the substrate is adjustable according to adjustment of the preferred actuating means disclosed later in the specification so that the risk of a defective chip/substrate assembly is minimized and suitable attachment to the epoxy or adhesive is made. Movement of the apparatus from the position disclosed in FIG. 5d to the position disclosed in FIG. 5e is achieved in less than about 30 milliseconds in the preferred embodiment. Once the position disclosed by the dash lines in FIG. 5e is achieved, the vacuum applied to chamber 31 of tool 19 is removed and face 19A of tool 19 no longer engages die 101. With the vacuum removed, tool 19 is actuated away from substrate 102 to the position indicated by the solid lines in FIG. 5e so as to release die 101. With die 101 properly placed on substrate 102, the substrate resumes its movement along track 12 so as to bring the next bond site 102A to a placement location coincidental with axis Z.

Once tool 19 has reached the position as shown by the solid lines in FIG. 5e, the tool is normally rotated about axis 21 (see FIG. 4) 180° and returns to the position disclosed in FIG. 5a. It should be noted that in the preferred embodiment tool 19 subtends substantially the same arc in its return to the position of FIG. 5a as was subtended by the chuck in moving from the position disclosed in FIG. 5c to the position disclosed in FIG. 5d, as long as the valid die 101 can be discerned and presented by the XY table. By oscillating back and forth in this manner, the optics 16 are locatable substantially to the right of the XZ plane as disclosed in FIGS. 3 and 5f. Referring now to FIG. 5f, chuck 19 is seen in a pause position after having rotated substantially only 150°. While this step is not normally included, it is used in the event that a suitable die 101 has not been properly located in a pickup location prior to the return of tool 19 to the position disclosed in FIG. 5a. This pausing step allows the optics 16 of this invention to continue to function until the die 101 has been properly located. As revealed in FIG. 5a, if tool 19 were to rotate a full 180° the functioning of optics 16, which includes mirror 45, would be obstructed and die 101 could not be properly located. On the other hand, it will be appreciated by those skilled in the art that the pausing step as disclosed in FIG. 5f is not required if the die 101 has been properly located prior to the time tool 19 reaches the pause position.

Die Bond and Die Eject-Actuation

Referring now to FIG. 4, the preferred apparatus for causing actuation of die eject head 18 and die bond head 15 is disclosed. In the preferred embodiment of this invention, die eject head 18 and die bond head 15 are each actuated by a separate moving coil transducer as shown in FIG. 4. Referring first to die bond head 15, housing 50 is mounted to mounting flange 51 which is in turn mounted to a central shaft 23 for rotation thereby. Housing 50 has a chamber therein which substantially encloses the cylindrical magnet 52 and voice coil 53 of the transducer. As previously described, support plate 27 is attached to the lower portion of voice coil 53.

Support plate 27 in turn supports and has mounted thereto left and right linear bearing shafts 25A and 25B. Voice coil 53 is in electrically conductive contact with an electrical energy source and receives electrical stimulus thereby. The electrical energy source and the means for connecting the energy source to the voice coil can be achieved by any one of several methods well known in the art and is therefore is not shown in FIG. 4. According to principles well known in the art, electrical stimulation of voice coil 53 causes an interaction between the coil and the transverse magnetic field disposed thereabout, said interaction causing the actuation of voice coil 53 with respect to magnet 52. Magnet 52 is securely mounted to housing 50 and therefore electrical stimulus of coil 53 causes the movement of plate 27 with respect to housing 50. In the preferred embodiment of this invention, the general features of the moving coil transducer assembly described above are well known in the art and moving coils of this type may be purchased from any of several well known manufacturers. The exact moving coil to be used is a function of many parameters of the die bonding apparatus in general, including size, speed, and cost. In the preferred embodiment of this invention, the die bond moving coil is available from Systems Magnetics Corporation of Anaheim, California or Kimco Corp. of California. Other embodiments of this invention may include replacing the moving coil described above with a moving iron transducer, an electrostatic transducer, a magnostrictive transducer, or a piezoelectric transducer. As is well known in the art, each of the actuating means described above is characterized in that the force and extent of actuation is functionally related to the extent of electrical stimulus applied. This feature embodies an important aspect of this invention in that adjustment of the electrical stimulus supplied to the transducer effects adjustment of the force and rate with which tool 19 is actuated. In this way, the force with which tool 19 engages and removes die 101 from wafer 100B and the force with which tool 19 places or bonds die 101 to substrate 102 is adjustable according to the electrical stimulus applied to the transducer.

Die bond head 15 of this invention also includes a tool locating means centrally disposed within housing 50 for locating tool 19 relative to wafer frame 100 and substrate 102. Core 54 is attached to support plate 27 and is centrally disposed within housing 50. When coil 53 is actuated by an electrical stimulus as described above, core 54 moves relative to cylindrical electromagnet 55. Thus, the interaction of core 54 with electromagnet 55 comprises a relative displacement transducer which acts according to principles well known in the art for sensing the position of tool 19. In the preferred embodiment of this invention, the reluctive displacement transducer is a linear-variable differential transformer (LVDT). This LVDT may be any one of several appropriate off the shelf LVDT's having transduction characteristics well known in the art. In a preferred embodiment of this invention, the LVDT used with bond head 15 of this invention is a 222C-K019 LVDT manufactured by Robinson-Halpern. In another embodiment, an inductance bridge may be used as a locating means.

Directing attention to actuating means 41, the means for actuating pin 38 of die eject head 18 is described. The die eject head actuating means 41 comprises a cylindrical housing 56 mounted to housing 32. Cylindrical magnets 57 are contained within and mounted to housing 56. A voice coil 42 is contained within the magnetic field created by the magnet and is mounted to support shaft 35 by bolt 58. Magnets 57 and voice coil 42 thus comprise a moving-coil transducer which acts according to principles well known in the art. As described earlier, application of electrical stimulus to voice coil 42 by any means well known in the art produces an interaction between the voice coil and the magnet such that support arm 35 and hence die eject pin 38 are actuated thereby. The moving coil of this invention is any appropriate well known moving coil manufactured by anyone of several well known manufactures. The exact moving coil which will be used is a function of many parameters of the die bonding apparatus in general, including size, speed, and ultimate cost. In the preferred embodiment of this invention, the die eject moving coil is available from Systems Magnetics Corporation of Anaheim, California or Kimco Corp. of California. Other embodiments of this invention may include replacing the moving coil described above with a moving iron transducer, an electrostatic transducer, a magnostrictive transducer, or a piezoelectric transducer. As is well known in the art, each of the actuating means described above is characterized in that the force and extent of actuation is functionally related to the extent of electrical stimulation applied. This feature embodies an important aspect of this invention in that adjustment of the electrical stimulus applied to the transducer effects adjustment of the force and rate with which die eject pin 38 is actuated. In this way, the force with which die eject pin 38 deforms film 100A and thereby interacts with die 101 is adjustable according to the electrical stimulus applied to the transducer.

The position of die eject pin 38 relative to wafer 100B is sensed in the preferred embodiment of this invention by core 59. Core 59 is mounted to voice coil 42 and travels between electromagnet 60 Core 59 and electromagnet 60 thus comprise a reluctive displacement transducer which, in the preferred embodiment of this invention is an LVDT. Thus, according to principles well known in the art, movement of die eject pin 38 relative to wafer 100B is detectable and sensible by the LVDT disclosed herein. Once again, the LVDT used with die eject head 18 is anyone of several LVDTs well known in the art which are available from anyone of several manufacturers. In the preferred embodiment of this invention, the LVDT used with the die eject head is a 2226-K0l9 LVDT manufactured by Robinson-Halpern. In another embodiment, an inductance bridge may be used as a locating means.

The actuating means disclosed in this section of the specification provide the important adjustability feature of this invention. This adjustability feature is enhanced when combined with the locating means provided by the LVDTs described above. That is, the LVDT's supply information concerning the position and rate of movement of tool 19 or die eject pin 38. With this information thus sensed, a basis for regulating the extent of electrical stimulus to the actuating means of this invention is provided. This combination has the distinct advantage of being adjustable according to the particular instantaneous operation of the apparatus. In particular, this combination is well suited for use with a computer wherein the signals generated by the LVDT are input and signals for regulating the extent of electrical stimulus are output.

Die Locating Means

Referring now to FIG. 1, the optics of this invention, generally designated as 16, are revealed. Optics 16 are used in conjunction with XY table 17 to precisely locate the die 101 in a proper pickup location Portion 16A of optics 16 contains a light source and various mirrors and lenses used to conduct light along the precise path indicated by the arrows marked L in FIG. 3. Portion 16B of optics 16 contains an optical receptor or camera for receiving optical input from portion 16A.

Referring now to FIG. 3, optics 16 and die eject head 15 are seen in a plan view from above die bond head 15. Light source 60 provides light which passes through lens 61 and 62. Light is then directed towards mirror 63 by slotted mirror 64. Slotted mirror 64 insures that the majority of the light from source 60 is directed towards mirror 63. Mirror 63 sits on a substantially 45° angle with respect to a horizontal plane and thus directs the light rays substantially perpendicular to wafer frame 100. It should be noted that a die 101 is placed in a proper pick-up location with the aid of optics 16 during that period of time in which tool 19 has been rotated out of an interfering position with respect to the path of light. That is, optics 16 operates to locate die 101 in a pickup position starting immediately after tool 19 moves from the position indicated in FIG. 5c. Tool 19 will not return to the position shown in FIG. 5a until a new die has been located at the pickup location. Thus, while die bond head 15 is performing the task of bonding a die to substrate 102, light source 60 provides means by which camera 65 can sense the position of a die 101 in the vicinity of the proper pickup location. The optics of this invention thus not only provide the means for locating die 101 but also a means for indicating the presence of a defective or substandard die in the pickup location. Additional details concerning the operation and function of optics 16 are disclosed in copending application bearing application Ser. No. 855,760, filed Apr. 24, 1986, which has been incorporated herein by reference.

Although particular embodiments of this invention have been described in detail for purposes of illustration, it will be appreciated that various modifications are within the spirit and scope of this invention The appended claims are intended to cover all such modifications

What is claimed is:

1. An apparatus for removing a die from a flexible adhesive film mounted wafer containing a plurality of dice and bonding the die to a bond site on a substrate having a plurality of bond sites thereon, said apparatus comprising:
   (a) component holding means, including an XY table for holding the dice side of said wafer upside down in a first substantially horizontal plane, said XY table being movable such that each die is locatable at a pickup location within said first plane;
   (b) a die eject pin above said wafer, including means for actuating said pin towards the film side of the wafer;
   (c) substrate holding means, including a substrate track for holding the substrate in a second substantially horizontal plane below said first plane, said substrate track being movable such that each of the bond sites is locatable at a bond location and aligned below said pickup location; and
   (d) a die bond head rotatably located between said first and second planes, including means for actuating said die bond head for removing the die from the flexible adhesive film and for placing the die on the substrate.

2. The apparatus of claim 1:
   (a) further comprising a die eject head having a coaxial bore therethrough and gripping means on the end thereof for releasably holding the film side of the wafer; and
   (b) wherein said die eject pin is coaxially movable within said bore.

3. The apparatus of claim 2 wherein said actuating means comprises a transducer responsive to electrical stimulus for actuating said pin such that the interactive force between said pin and the wafer is related to the extent of electrical stimulus.

4. The apparatus of claim 3 wherein said transducer comprises a moving coil transducer.

5. The apparatus of claim 3 wherein said transducer comprises a moving iron transducer.

6. The apparatus of claim 3 wherein said transducer comprises a magnetostrictive transducer.

7. The apparatus of claim 3 wherein said transducer comprises a piezoelectric transducer.

8. The apparatus of claim 2 further comprising means for indicating the position of said pin with respect to the end of said gripping means.

9. The apparatus of claim 8 wherein said indicating means comprises a reluctive displacement transducer having the core thereof attached to said pin.

10. The apparatus of claim 10 wherein said reluctive displacement transducer comprises a linear-variable differential transformer.

11. The apparatus of claim 9 wherein said reluctive displacement transducer comprises an inductance bridge.

12. An apparatus for removing an electrical component from a flexible adhesive film containing a plurality of electrical components and placing the electrical component on a substrate having a placement site thereon, said apparatus comprising:
   (a) component holding means for holding the electrical component side of the film upside down in a first substantially horizontal plane and moving said film within said first plane so as to place the electrical components at a pickup location;
   (b) substrate holding means for holding the substrate in a second substantially horizontal plane and moving the substrate so as to place the substrate placement site in alignment with said pickup location; and
   (c) a single head between said first plane and said second plane for releasably holding the electrical component, said head being rotatable about an axis substantially parallel to said planes for transfer of the electrical component from the film to the substrate.

13. The apparatus of claim 12 wherein said component holding means comprises an XY table supporting the film.

14. The apparatus of claim 12, wherein said substrate holding means comprises a movable track for supporting the substrate.

15. The apparatus of claim 12 wherein said head comprises:
   (a) gripping means for releasably holding the electrical component;

(b) means for rotating said gripping means such that said gripping means is movable from the pickup position to the placement position; and (c) means for actuating said gripping means during removal of the electrical component from the wafer and during placement of the electrical component on the substrate.

16. The apparatus of claim 15 wherein said actuating means comprises a transducer attached to said gripping means and responsive to the application of electrical energy.

17. The apparatus of claim 16 wherein said transducer comprises a moving-coil transducer.

18. The apparatus of claim 16 wherein said transducer comprises a moving-iron transducer.

19. The apparatus of claim 16 wherein said transducer comprising a magnetostrictive transducer.

20. The apparatus of claim 16 wherein said transducer comprises a piezoelectric transducer.

21. The apparatus of claim 15 further comprising means for indicating the position of said gripping means with respect to the axis of rotation of said gripping means.

22. The apparatus of claim 23 wherein said indicating means comprises a reluctive displacement transducer having the sensing shaft thereof attached to said gripping means.

23. The apparatus of claim 21 wherein said reluctive displacement transducer comprises a linear variable differential transformer.

24. The apparatus of claim 21 wherein said reluctive displacement transducer comprises an inductance bridge.

25. An apparatus for the placement of component parts on a substrate comprising:
  (a) component holding means for holding a plurality of component parts in a first plane;
  (b) substrate holding means for holding the substrate in a second plane substantially parallel to and spaced from said first plane; and
  (c) component transfer means located between said first and second planes movable between a pickup position and a placement position for transfer of the component from said component holding means to the substrate such that the component moves through a path which is not primarily parallel to said planes.

26. The apparatus of claim 25 wherein said component holding means includes means for moving the component to a pickup location substantially within said first plane.

27. The apparatus of claim 26 wherein said substrate holding means includes means for moving the substrate to a placement location within said second plane 28. The apparatus of claim 27 wherein the pickup location is substantially aligned with the placement location.

29. The apparatus of claim 26 wherein:
  (a) said component holding means includes a film having a plurality of components removably attached thereto; and
  (b) said component moving means comprises an XY table supporting said film such that each of said components is locatable at the pickup location.

30. The apparatus of claim 27 wherein:
  (a) said substrate holding means further includes a track for supporting the substrate; and (b) said substrate moving means comprises said track being movable.

31. The apparatus of claim 30 wherein said component transfer means comprises:
  (a) interacting means for interacting with the component; and
  (b) means for actuating said interacting means for removal of the component from said film or placement of the component on the substrate.

32. The apparatus of claim 31 further comprising means for rotating said interacting means about an axis parallel to said plane such that said interacting means is movable from the pickup position to the placement position.

33. The apparatus of claim 31 wherein said actuating means comprises a transducer attached to said interacting means and responsive to electrical stimulus.

34. The apparatus of claim 33 wherein said transducer comprises a moving-coil transducer.

35. The apparatus of claim 33 wherein said transducer comprises a moving-iron transducer.

36. The apparatus of claim 33 wherein said transducer comprises a magnetostrictive transducer.

37. The apparatus of claim 33 wherein said transducer comprises a piezoelectric transducer.

38. The apparatus of claim 31 further comprising means for indicating the position of said interacting means with respect to said actuating means 39. The apparatus of claim 38 wherein said indicating means comprises a reluctive displacement transducer having the core thereof attached to said interacting means.

40. The apparatus of claim 39 wherein said reluctive displacement transducer comprises a linear-variable differential transformer.

41. The apparatus of claim 39 wherein said reluctive displacement transducer comprises an inductance bridge.

42. In a component assembly apparatus of the type having a head for the placement or removal of the component wherein the placement or removal produces a removal or placement force between the head and the component, a head comprising:
  (a) a head having a gripper means on the end thereof and a coaxial bore therethrough for releasably holding said component, and a pin within said bore
  (b) a first transducer means responsive to electrical stimulus for actuating said head such that the removal or placement force between said head and the component is related to the extent of electrical stimulus;
  (c) said pin being attached to said transducer means and moveable thereby to a protruding position with respect to the end of said head; and
  (d) a reluctive displacement transducer attached to said head for indicating the gripping means.

43. The apparatus of claim 41 wherein said transducer means comprises a moving-coil transducer.

44. The apparatus of claim 42 wherein said transducer means comprises a moving-iron transducer 45. The apparatus of claim 42 wherein said transducer comprises a magnetostrictive transducer.

46. The apparatus of claim 42 wherein said transducer comprises a piezoelectric transducer.

47. A method for transferring a component part from a film having a plurality of component parts removably adhered thereto to a substrate, said method comprising:

(a) holding said film and said substrate in spaced and substantially parallel planes;
(b) removing the component from the film with a tool located between the planes and adapted to releasably hold the component;
(c) rotating the tool about an axis substantially parallel to said planes; and
(d) placing the component on the substrate.

48. The method of claim 47 further comprising:
(a) locating said component at a pickup location within said plane by moving said film within said plane; and
(b) aligning said substrate with respect to said pickup location.

49. The method of claim 48 wherein said locating step further comprises:
(a) optically sensing the location of the component to be transferred.

50. The method of claim 49 wherein said rotating step comprises:
(a) rotating the tool substantially 180° from a pickup position in which said tool is aligned with the pickup location to a placement position; and
(b) further rotating the tool 180° from the placement position to the pickup position.

51. The method of claim 50 wherein said locating step occurs between the start of said rotating step and the completion of said further rotating step.

52. The method of claim 51 wherein said further rotation is substantially the reverse of said rotating step.

53. The method of claim 51 wherein said further rotating step includes a pausing step in which said tool pauses for a measurable time prior to completion of the further rotating step to allow optical sensing of component.

54. The method of claim 52 wherein said pausing step occurs during said locating step.

* * * * *